(12) United States Patent
Choi et al.

(10) Patent No.: US 6,169,327 B1
(45) Date of Patent: Jan. 2, 2001

(54) METAL INTERCONNECTION STRUCTURE OF SEMICONDUCTOR DEVICE

(75) Inventors: Kyeong Keun Choi, Suwon; Gyu Cheol Sim, Ich'on, both of (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/104,493

(22) Filed: Jun. 25, 1998

(30) Foreign Application Priority Data

Jun. 28, 1997 (KR) .................................. 97-28812

(51) Int. Cl.⁷ .................................................. H01L 23/48
(52) U.S. Cl. ........................... 257/754; 257/750; 257/755
(58) Field of Search .................... 257/750, 754, 257/755, 756, 380, 381, 382, 383, 384, 751, 752; 437/765, 767

(56) References Cited

U.S. PATENT DOCUMENTS

| | | | |
|---|---|---|---|
| 5,032,233 | * 7/1991 | Yu et al. ........................ | 204/192.28 |
| 5,798,568 | * 8/1998 | Abercrombie et al. .............. | 257/758 |
| 5,950,107 | * 9/1999 | Huff et al. ........................ | 438/669 |
| 6,005,277 | * 12/1999 | Liu et al. ........................ | 257/437 |

* cited by examiner

*Primary Examiner*—David Hardy
*Assistant Examiner*—Lourdes Cruz
(74) *Attorney, Agent, or Firm*—Selitto & Associates

(57) ABSTRACT

A metal interconnection structure of a semiconductor device includes a metal layer having a high surface reflectivity and an ARC layer formed on the metal layer. Here, the ARC layer has a first layer formed on the metal layer and a second layer formed on the first layer. The first layer has a good step coverage property, while the second layer has a low surface reflectivity. Preferably, the first layer is a polysilicon layer, while the second layer is a CVD-TiN layer. The polysilicon layer is formed to the thickness of 50 to 300 Å, while the CVD-TiN layer is formed to the thickness of 100 to 300 Å. Furthermore, the metal layer is made of one material selected from the group consisting of aluminum, aluminum alloy, tungsten, and copper. Preferably, the metal layer is an aluminum layer.

8 Claims, 2 Drawing Sheets

METAL INTERCONNECTION STRUCTURE OF SEMICONDUCTOR DEVICE

BACKGROUND OF THE INVENTION

1. Field of the Invention

The present invention relates to a metal interconnection structure of a semiconductor device, and more particularly to a metal interconnection structure of a semiconductor device having a novel ARC layer being capable of preventing reflection of a metal interconnection and improving a step coverage thereof.

2. Description of the Related Art

In general, an aluminum is widely used as the material for a metal interconnection because of its low resistivity. However, when the aluminum is patterned by photolithography, an interconnection badness occurs by a notching due to the high surface reflectivity of the aluminum. To solve this problem, the aluminum is patterned by photolithography, after an anti-reflective coating (ARC) layer is formed thereon, thereby preventing the surface reflectivity of the aluminum. The ARC layer is made of a TiN.

FIG. 1 shows a conventional metal interconnection structure wherein an ARC layer is formed on an aluminum layer. With reference to FIG. 1, an insulating layer 12 is formed on a semiconductor substrate 10 on which a conductive layer pattern 11 is formed. The insulating layer 12 has a contact hole 13 exposing a portion of the conductive layer pattern 11. On the surface of the contact hole 13 and the insulating layer 12, is formed a barrier metal layer 14. An aluminum layer 15 is formed on the barrier metal layer 14 as an interconnection material. An ARC layer is formed on the aluminum layer 15 for preventing reflection of the aluminum layer 15. Preferably, the ARC layer is made of a TiN layer 16. The TiN layer 16 is a PVD-TiN layer formed by a Physical Vapor Deposition (PVD).

However, this conventional interconnection structure above described has the following problems due to a grain boundary of the aluminum layer 15. FIG. 2 is an enlarged view of "A" portion in FIG. 1. Referring to FIG. 2, a fine void B exists between grains of the aluminum layer 15 since the grain boundary of the aluminum layer 15 is not uniform. As a result, portions of the TiN layer 16 are thinly formed on the aluminum layer 15. Furthermore, a crack occurs at the TiN layer 16, whereby a step coverage of a metal interconnection becomes poor. Moreover, since residues of photoresist and chemical materials remain in the void after performing the photolithography, defects occur in the metal interconnection. For the purpose of preventing the defects, a method by which the TiN layer 16 is thickly formed, is proposed. However, a bridge occurs between interconnections due to the thick TiN layer 16.

SUMMARY OF THE INVENTION

It is therefore an object of the present invention to provide a metal interconnection structure of a semiconductor device having a novel ARC layer being capable of preventing reflection of an interconnection metal and improving a step coverage thereof for solving the problems in the conventional art.

To accomplish this above object, a metal interconnection structure of a semiconductor device according to the present invention includes a metal layer having a high surface reflectivity and an ARC layer formed on the metal layer. The ARC layer has a first layer formed on the metal layer and a second layer formed on the first layer. The first layer has a good step coverage property, and the second layer has a low surface reflectivity.

Preferably, the first layer, is a polysilicon layer and the second layer is a CVD-TiN layer. The polysilicon layer is formed to the thickness of 50 to 300 Å, and the CVD-TiN layer is formed to the thickness of 100 to 300 Å. Furthermore, the metal layer is made of one material selected from the group consisting of aluminum, aluminum alloy, tungsten, and copper. Preferably, the metal layer is an aluminum layer.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained in more detail with reference to the accompanying drawings.

Figure 1:
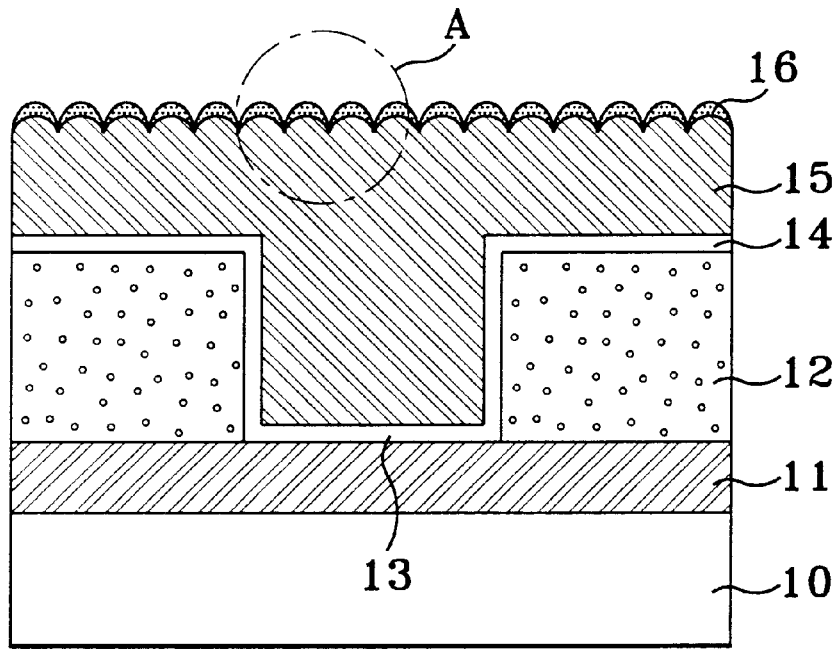
FIG. 1 shows a cross sectional view of a conventional metal interconnection structure of a semiconductor device.
Figure 2:
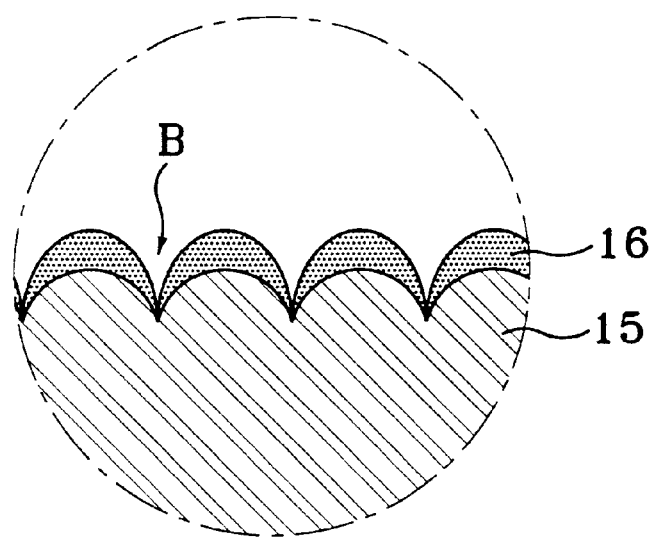
FIG. 2 is an enlarged view of "A" portion in FIG. 1.
Figure 3:
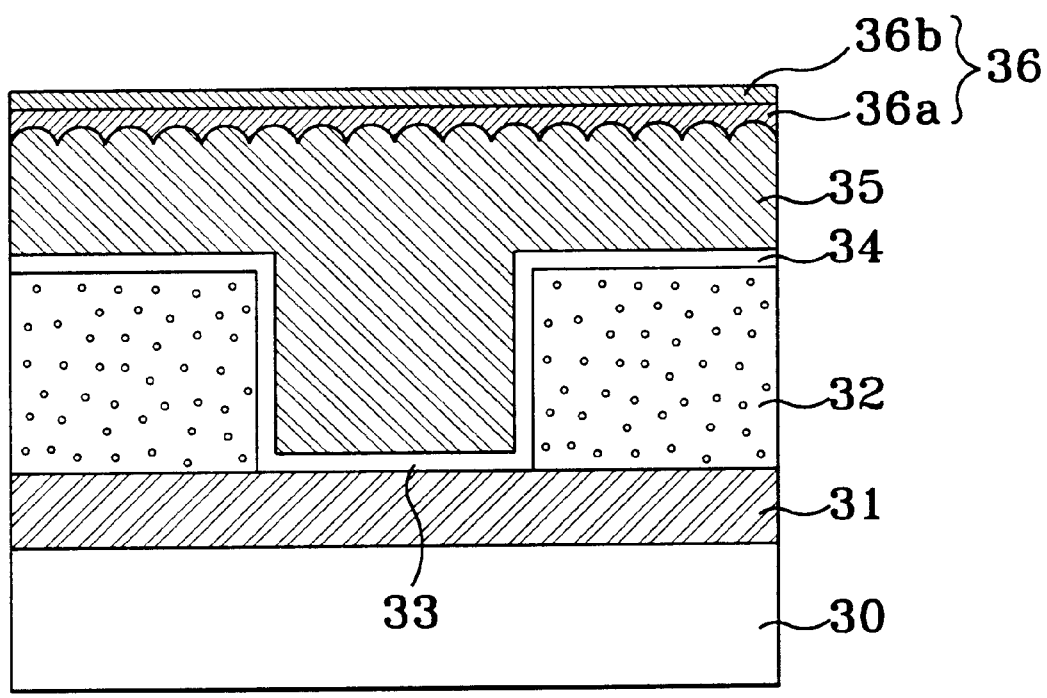
FIG. 3 shows a cross sectional view of a metal interconnection structure of a semiconductor device according to an embodiment of the present invention.

FIG. 3 shows a cross sectional view of a metal interconnection structure of a semiconductor device according to an embodiment of the present invention.

Referring to FIG. 3, on a semiconductor substrate 30 on which a conductive layer pattern 31 is formed, an insulating layer 32 is formed. The insulating layer 32 has a contact hole 33 exposing a portion of the conductive layer pattern 31. On the surface of the contact hole 33 and the insulating layer 32, is formed a barrier metal layer 34. A metal layer used in interconnection is formed on the barrier metal layer 34. The metal layer is made of one material selected from the group consisting of aluminum, aluminum alloy, tungsten, and copper. Preferably, the metal layer is made of an aluminum layer 35. An ARC layer 36 is formed on the aluminum layer 35 for preventing surface reflection of the aluminum layer 35. At this time, the ARC layer 36 is made of a first layer, the step coverage of which is good, and a second layer, the surface reflectivity of which is low. Preferably, the first layer is a polysilicon layer 36a and the second layer is a CVD-TiN layer 36b formed by a Chemical Vapor Deposition (CVD).

A method of forming the ARC layer will be explained in more detail. Firstly, the polysilicon layer 36a is formed on the aluminum layer 35 by a Low Pressure CVD (LPCVD) or a Plasma Enhanced CVD (PECVD) using either one of a $PH_3$ or $AsH_3$ gas, and a $SiH_4$ gas at low temperature. Preferably, the polysilicon layer 36a is formed to the thickness of about 50 to 200 Å. For example, if the polysilicon layer 36a is formed by the LPCVD, it is performed using a $SiH_4$ gas of 100 to 1,000 SCCM, a $PH_3$ gas of 10 to 200 SCCM, and a H gas of 1 to 71 SCCM at the temperature of 400 to 550° C. At this time, owing to the good step coverage property of the polysilicon layer 36a, the voids(refer to FIG.

2) between the grains of the aluminum layer 35 are filled with the polysilicon layer 36a, as show in FIG. 3.

Next, the CVD-TiN layer 36b is formed on the polysilicon layer 36a by the LPCVD using one gas selected from the group consisting of TDMAT(Tetrakis DiMethyl Amino Titanium), TDEAT (Tetrakis Di-Ethyl Amino Titanium), and TiCl$_4$ as a source gas. Preferably, the CVD-TiN layer 36b is formed to the thickness of about 100 to 300 Å. For example, if the TDMAT is used as the source gas, the LPCVD is performed using He gas of about 10 to 100 SCCM at temperature of about 300 to 450° C.

Furthermore, the thicknesses of the polysilicon layer 36a and the CVD-TIN layer 36b are respectively determined by the thickness and reflectivity of the aluminum layer 35. For example, if the thickness of the aluminum layer 35 is about 8,000 Å, the thickness of the polysilicon layer 36a is about 100 Å and the thickness of the CVD-TiN layer 36b is about 200 Å. At this time, in case if light wavelength is 436 μm, reflectivity of the CVD-TiN layer 36b to the polysilicon layer 36a is 40 to 60%.

As above described, the ARC layer is made of a stack of the polysilicon layer and CVD-TiN layer on the aluminum layer. As a result, owing to the good step coverage property of the polyislicon layer, the voids between the grains of the aluminum layer are filled with the polysilicon layer, so that the step coverage of the metal interconnection is improved thereby preventing the defects due to the voids. Furthermore, owing to the low reflectivity of the CVD-TiN layer, a notching is prevented in the process of preforming photo-lithography. Moreover, since the ARC layer is substantially formed as a thin film, bridge between the metal inter-connections is prevented. Finally, the reliability of the metal interconnection is improved.

Although the preferred embodiment of this invention has been disclosed for illustrative purposes, those skilled in the art will appreciate that various modifications, additions and substitutions are possible, without departing from the scope and spirit of the invention as described in the accompanying claims.

What is claimed is:

1. A metal interconnection structure of a semiconductor device, comprising:
    a metal layer having a high surface reflectivity; and
    an ARC layer formed on the metal layer, the ARC layer including a first layer, which is formed on the metal layer and which has a good step coverage property, and a second layer which is formed on the first layer and which has a low surface reflectivity, wherein the first layer is a polysilicon layer.

2. The metal interconnection structure according to claim 1, wherein the polysilicon layer has a thickness ranging from 50 Å to 300 Å.

3. The metal interconnection structure according to claim 1, wherein the second layer is a TiN layer.

4. The metal interconnection structure according to claim 3, wherein the TiN layer is a CVD-TiN layer.

5. The metal interconnection structure according to claim 4, wherein the CVD-TiN layer has a thickness ranging from 100 Å to 300 Å.

6. The metal interconnection structure according to claim 4, wherein the polysilicon layer has a thickness ranging from 50 Å to 300 Å; and wherein the CVD-TiN layer has a thickness ranging from 100 Å to 300 Å.

7. The metal interconnection structure according to claim 1, wherein the metal layer is made of a material selected from the group consisting of aluminum, aluminum alloy, tungsten and copper.

8. The metal interconnection structure according to claim 7, wherein the metal layer is an aluminum layer.

* * * * *